(12) United States Patent
Lu et al.

(10) Patent No.: US 8,424,357 B2
(45) Date of Patent: Apr. 23, 2013

(54) EASILY STACKABLE DIES

(75) Inventors: Leo Lu, Taoyuan County (TW); Kuei-Wu Chu, Taoyuan County (TW); Jimmy Liang, Taoyuan County (TW)

(73) Assignee: Aflash Technology Co., Ltd., Luzhu Township, Taoyuan County (TW)

( * ) Notice: Subject to any disclaimer, the term of this patent is extended or adjusted under 35 U.S.C. 154(b) by 94 days.

(21) Appl. No.: 12/796,101

(22) Filed: Jun. 8, 2010

(65) Prior Publication Data
US 2011/0023574 A1 Feb. 3, 2011

(30) Foreign Application Priority Data
Jul. 30, 2009 (TW) .............................. 98213946 U

(51) Int. Cl.
*B21D 37/16* (2006.01)
(52) U.S. Cl.
USPC ..................................... 72/342.92; 72/478

(58) Field of Classification Search ............. 72/476, 72/478, 342.7, 342.8, 342.92; 29/739, 740, 29/825, 830, 832, 840, 846
See application file for complete search history.

(56) References Cited

U.S. PATENT DOCUMENTS

| | | | | |
|---|---|---|---|---|
| 5,369,379 | A * | 11/1994 | Fujiki ............................ | 333/116 |
| 5,517,751 | A * | 5/1996 | Bross et al. ...................... | 29/830 |
| 6,956,449 | B2 * | 10/2005 | Snyder et al. .................. | 333/116 |
| 7,587,817 | B2 * | 9/2009 | Williams ........................ | 29/884 |
| 7,748,110 | B2 * | 7/2010 | Asahi et al. ..................... | 29/830 |
| 7,851,921 | B2 * | 12/2010 | Nakasato et al. ............. | 257/773 |

\* cited by examiner

*Primary Examiner* — Bena Miller
(74) *Attorney, Agent, or Firm* — Muncy, Geissler, Olds & Lowe, PLLC

(57) ABSTRACT

A die includes upper contacts, lower contacts and conductive elements. The upper contacts are formed on an upper face of the die. The upper contacts include a non-connected upper contact and connected upper contacts. The lower contacts are formed on a lower face of the die. The lower contacts include a non-connected lower contact and connected lower contacts. Each of the conductive elements connects a related one of the connected upper contacts to a related one of the connected lower contacts.

8 Claims, 4 Drawing Sheets

EASILY STACKABLE DIES

BACKGROUND OF INVENTION

1. Field of Invention

The present invention relates to a die and, more particularly, to a die that can easily be stacked with other dies and that is made by masks that can easily be designed and managed.

2. Related Prior Art

Traditionally, different masks are used to make different layouts on upper and lower faces of a die according to different contacts and layouts. A die can be stacked with other dies. After the dies are stacked, wires are used to connect the contacts of each of the dies to the contacts of another one of the dies. However, the design of a system of such dies is limited, and the stacking of such dies is not easy. Moreover, the contacts and layout on the upper face of the die and the contacts and layout on the lower face of the die are made by different masks. The masks cannot be used in place of each other. The management of the masks is troublesome.

The present invention is therefore intended to obviate or at least alleviate the problems encountered in prior art.

SUMMARY OF INVENTION

It is the primary objective of the present invention to provide a die that can easily be stacked with other dies.

To achieve the foregoing objective, the die includes upper contacts, lower contacts and conductive elements. The upper contacts are formed on an upper face of the die. The upper contacts include a non-connected upper contact and connected upper contacts. The lower contacts are formed on a lower face of the die. The lower contacts include a non-connected lower contact and connected lower contacts. Each of the conductive elements connects a related one of the connected upper contacts to a related one of the connected lower contacts.

Other objectives, advantages and features of the present invention will be apparent from the following description referring to the attached drawings.

BRIEF DESCRIPTION OF DRAWINGS

The present invention will be described via detailed illustration of the preferred embodiment referring to the drawings wherein.

DETAILED DESCRIPTION OF PREFERRED EMBODIMENT

Figure 1:
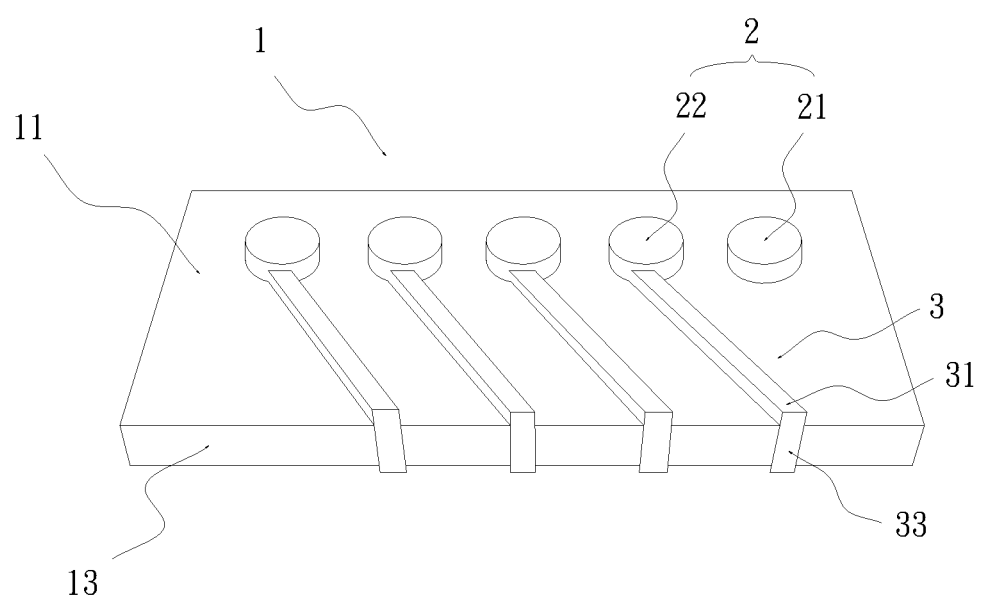
FIG. 1 is a perspective view of a die according to the preferred embodiment of the present invention.
Figure 2:
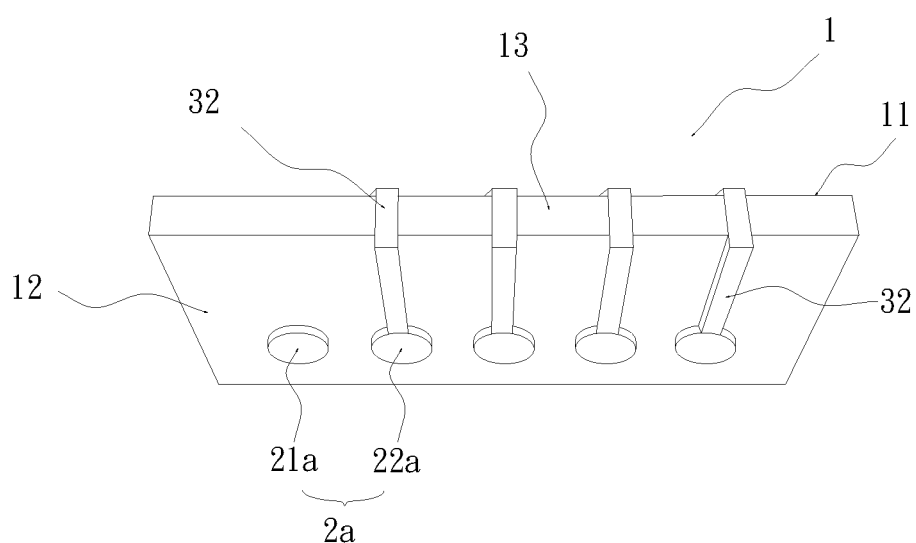
FIG. 2 is another perspective view of the die shown in FIG. 1.

Referring to FIGS. 1 and 2, there is shown a die 1 according to the preferred embodiment of the present invention. The die 1 includes an upper face 11, a lower face 12 and a lateral face 13 extending between the upper face 11 and the lower face 12.

There are upper contacts 2 formed on the upper face 11 of the die 1. The upper contacts 2 include a non-connected upper contact 21 and connected upper contacts 22. The first upper contact 2 is preferably the non-connected upper contact 21. The other upper contacts 2 are the connected upper contacts 22.

There are lower contacts 2a formed on the lower face 12 of the die 1. The lower contacts 2a include a non-connected lower contact 21a and connected lower contacts 22a. The last lower contact 2a is preferably the non-connected lower contact 21a. The other lower contacts 2a are the connected lower contacts 22a.

There are conductive elements 3 for connecting the connected upper contacts 22 to the connected lower contacts 22a. Each of the conductive elements 3 includes an upper conductive portion 31 extending on the upper face 11 of the die 1, a lower conductive portion 32 extending on the lower face 12 of the die 1, and a lateral conductive portion 33 extending to the upper conductive portion 31 from the lower conductive portion 32 on the lateral face 13 of the die 1.

Figure 3:
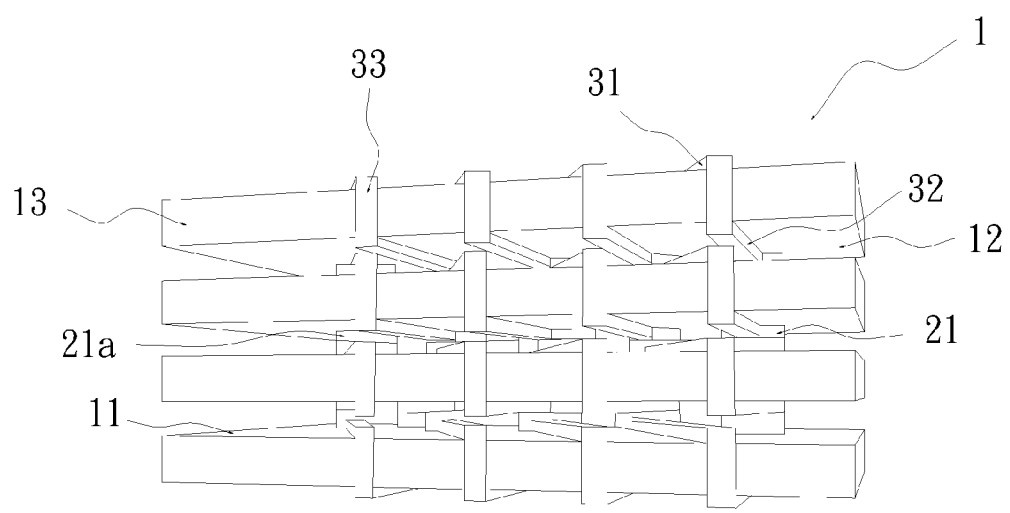
FIG. 3 is a perspective view of a stack of dies as shown in FIG. 1.

Referring to FIG. 3, there is shown a stack of dies 1 as shown in FIGS. 1 and 2. The first connected lower contact 22 of each of the dies 1 is connected to the non-connected upper contact 21 of a lower one of the dies 1. The second connected lower contact 22 of the upper die 1 is connected to the first connected upper contact 22 of the lower die 1. The third connected lower contact 22 of the upper die 1 is connected to the second connected upper contact 22 of the lower die 1. The fourth connected lower contact 22 of the upper die 1 is connected to the third connected upper contact 22 of the lower die 1.

Figure 4:
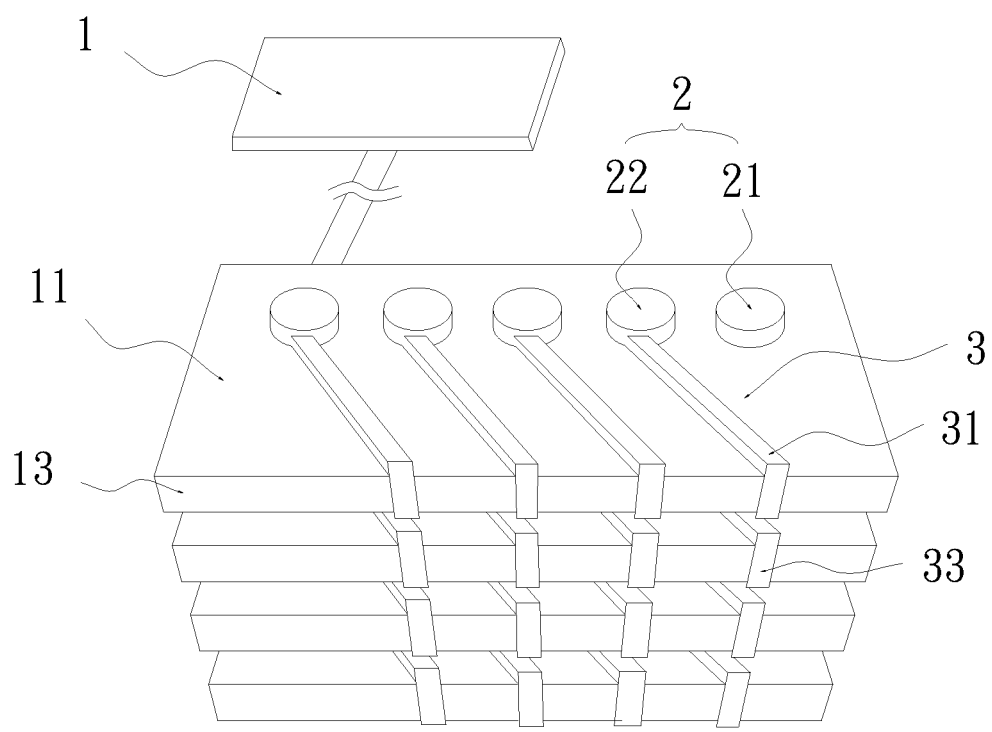
FIG. 4 is a perspective view of a control circuit board connected to the stack of dies shown in FIG. 3.

Referring to FIG. 4, a control circuit board 4 is connected to the stack of dies 1. More particularly, the control circuit board 4 is directly connected to the first die 1. For example, the second, third and fourth connected contacts 22 of the first die 1 are used to control the second, third and fourth dies 1, respectively. The non-connected contact 21 of the first die 1 is used to test whether the lateral conductive portion 33 of the conductive elements 3 of any one of the dies 1 is connected. Thus, there is no need for any jumper to use the stack of dies 1.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A die including:
    an upper face;
    a lower face;
    a lateral face extending between the upper and lower faces;
    upper contacts formed in a predetermined contact layout on the upper face of the die, wherein the upper contacts include a non-connected upper contact and connected upper contacts;
    lower contacts formed in the same predetermined contact layout as the upper contacts on the lower face of the die, wherein the lower contacts include a non-connected lower contact and connected lower contacts, wherein when two dies stacked together, each of the lower contacts of the upper one die is one to one connected to a corresponding upper contact of the upper contacts of the lower one die respectively because of the same predetermined contact layout; and
    conductive elements each including an upper conductive portion extending on the upper face of the die, a lower conductive portion extending on the lower face of the die, and a lateral conductive portion extending on the lateral face of the die for connecting a related one of the connected upper contacts one to one to a related one of the connected lower contacts.

2. The die according to claim 1, wherein a first one of the upper contacts is the non-connected upper contact.

3. The die according to claim 1, wherein a last one of the lower contacts is the non-connected lower contact.

4. A stack of dies including:
at least two dies stacked, each die including:
an upper face;
a lower face;
a lateral face extending between the upper and lower faces;
upper contacts formed in a predetermined contact layout on the upper face of the die, wherein the upper contacts include a non-connected upper contact and connected upper contacts;
lower contacts formed in the same predetermined contact layout as the upper contacts on the lower face of the die, wherein the lower contacts include a non-connected lower contact and connected lower contacts; and
conductive elements each including an upper conductive portion extending on the upper face of the die, a lower conductive portion extending on the lower face of the die, and a lateral conductive portion extending on the lateral face of the die for connecting a related one of the connected upper contacts one to one to a related one of the connected lower contacts;
wherein each of the lower contacts of an upper die of the at least two dies stacked is one to one connected to a corresponding upper contact of a lower die of the at least two dies stacked because of the same predetermined contact layout.

5. The stack of dies according to claim 4, wherein a first one of the upper contacts is the non-connected upper contact.

6. The stack of dies according to claim 4, wherein a last one of the lower contacts is the non-connected lower contact.

7. The stack of dies according to claim 4, wherein the upper contacts formed in a predetermined contact layout and the upper conductive portions on the upper face of each of the at least two dies stacked are made by a mask with a predetermined contact layout while the lower contacts formed in a predetermined contact layout and the lower conductive portions on the lower face of each of the at least two dies stacked are made by another mask with a predetermined contact layout.

8. The stack of dies according to claim 4, further comprising a control circuit board directly connected to the upper contacts of the upper one die.

* * * * *